(12) United States Patent
Varadarajan et al.

(10) Patent No.: US 9,852,901 B2
(45) Date of Patent: Dec. 26, 2017

(54) SYSTEMS AND METHODS FOR REDUCING BACKSIDE DEPOSITION AND MITIGATING THICKNESS CHANGES AT SUBSTRATE EDGES

(71) Applicant: LAM RESEARCH CORPORATION, Fremont, CA (US)

(72) Inventors: Sesha Varadarajan, Oswego, OR (US); Shankar Swaminathan, Beaverton, OR (US); Saangrut Sangplung, Sherwood, OR (US); Frank Pasquale, Tualatin, OR (US); Ted Minshall, Sherwood, OR (US); Adrien Lavoie, Newberg, OR (US); Mohamed Sabri, Beaverton, OR (US); Cody Barnett, Portland, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/255,337

(22) Filed: Sep. 2, 2016

(65) Prior Publication Data

US 2016/0372318 A1 Dec. 22, 2016

Related U.S. Application Data

(62) Division of application No. 14/485,142, filed on Sep. 12, 2014, now Pat. No. 9,460,915.

(51) Int. Cl.
*H01L 21/31* (2006.01)
*H01L 21/02* (2006.01)
(Continued)

(52) U.S. Cl.
CPC ...... *H01L 21/0228* (2013.01); *C23C 16/4585* (2013.01); *C23C 16/45525* (2013.01);
(Continued)

(58) Field of Classification Search
CPC .......... H01L 21/0228; H01L 21/02164; H01L 21/0217; H01L 21/02186; H01L 21/02274;
(Continued)

(56) References Cited

U.S. PATENT DOCUMENTS

| 5,238,499 A | 8/1993 | van de Ven et al. |
| 5,275,976 A | 1/1994 | Moslehi |
| 5,292,554 A * | 3/1994 | Sinha .................. C23C 16/4401 118/500 |
| 5,505,779 A * | 4/1996 | Mizuno ............... C23C 16/4401 118/719 |

(Continued)

FOREIGN PATENT DOCUMENTS

| CN | 101147248 A | 3/2008 |
| CN | 102067279 A | 5/2011 |
| EP | 1126047 A1 | 8/2001 |

OTHER PUBLICATIONS

First Office Action corresponding to Chinese Patent Application No. 201510582177.1 dated Jul. 3, 2017, 7 pages.

*Primary Examiner* — Syed Gheyas

(57) ABSTRACT

A substrate processing system for depositing film on a substrate includes a processing chamber defining a reaction volume and including a substrate support for supporting the substrate. A gas delivery system is configured to introduce process gas into the reaction volume of the processing chamber. A plasma generator is configured to selectively generate RF plasma in the reaction volume. A clamping system is configured to clamp the substrate to the substrate support during deposition of the film. A backside purging system is configured to supply a reactant gas to a backside edge of the substrate to purge the backside edge during the deposition of the film.

7 Claims, 8 Drawing Sheets

(51) Int. Cl.
*C23C 16/455* (2006.01)
*C23C 16/458* (2006.01)
*C23C 16/505* (2006.01)
*C23C 16/52* (2006.01)

(52) U.S. Cl.
CPC .. *C23C 16/45544* (2013.01); *C23C 16/45597* (2013.01); *C23C 16/505* (2013.01); *C23C 16/52* (2013.01); *H01L 21/0217* (2013.01); *H01L 21/02164* (2013.01); *H01L 21/02186* (2013.01); *H01L 21/02274* (2013.01)

(58) Field of Classification Search
CPC ........ C23C 16/45525; C23C 16/45544; C23C 16/45597; C23C 16/4585; C23C 16/505; C23C 16/52
See application file for complete search history.

(56) References Cited

U.S. PATENT DOCUMENTS

| | | |
|---|---|---|
| 5,871,811 A | 2/1999 | Wang et al. |
| 6,037,258 A * | 3/2000 | Liu .................... H01L 21/7684 257/E21.583 |
| 6,159,299 A | 12/2000 | Koai et al. |
| 6,190,732 B1 * | 2/2001 | Omstead ............. C23C 16/4408 118/729 |
| 6,223,447 B1 | 5/2001 | Yudovsky et al. |
| 7,993,465 B2 | 8/2011 | Jennings et al. |
| 2003/0141018 A1 * | 7/2003 | Stevens ............. H01L 21/67126 156/345.51 |
| 2003/0172872 A1 | 9/2003 | Thakur et al. |
| 2008/0179287 A1 | 7/2008 | Collins et al. |
| 2011/0263123 A1 | 10/2011 | Gomi et al. |

* cited by examiner

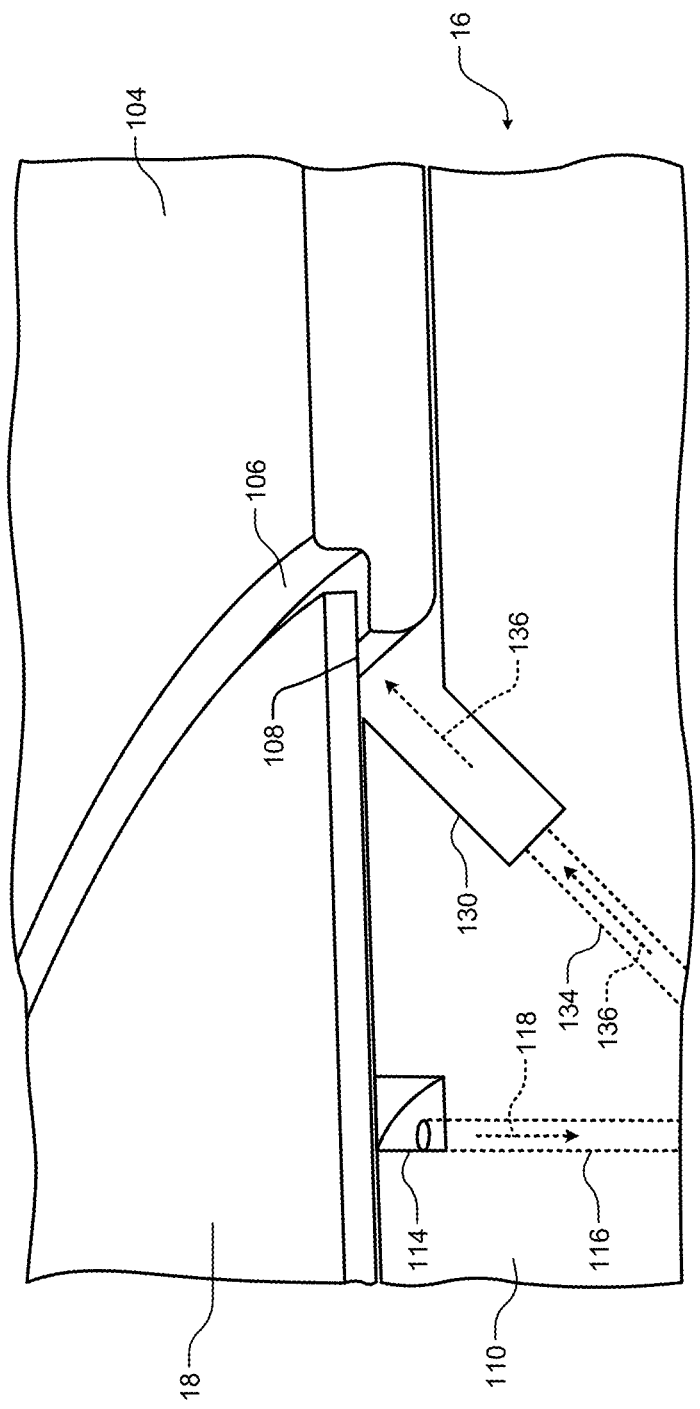

SYSTEMS AND METHODS FOR REDUCING BACKSIDE DEPOSITION AND MITIGATING THICKNESS CHANGES AT SUBSTRATE EDGES

CROSS-REFERENCE TO RELATED APPLICATIONS

The present disclosure is a divisional of U.S. patent application Ser. No. 14/485,142 filed on Sep. 12, 2014. The entire disclosure of the application referenced above is incorporated herein by reference.

FIELD

The present disclosure relates to substrate processing systems, and more particularly to systems and methods for reducing backside film deposition and mitigating thickness changes at substrate edges during film deposition.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition of film on a substrate. Substrate processing systems typically include a processing chamber defining a reaction volume. A substrate support such as a pedestal, a chuck, a plate, etc. is arranged in the processing chamber. A substrate such as a semiconductor wafer may be arranged on the substrate support. During atomic layer deposition (ALD), one or more ALD cycles are performed to deposit film on the substrate. For plasma-based ALD, each ALD cycle includes precursor dose, purge, RF plasma dose, and purge steps.

During deposition of film onto the substrate, deposition may also occur in locations other than the top portion of the substrate where it is desired. Deposition may occur along a backside edge of the substrate (hereinafter "backside edge deposition"). The backside edge deposition may cause problems during subsequent processing. In spacer applications, backside edge deposition may cause defocusing issues during subsequent lithography steps.

Since ALD films are inherently conformal (due to the surface-saturated mechanism), both half reactions should be minimized on the backside of the substrate. In other words, flow of precursor to the backside of the substrate during the precursor dose should be minimized or eliminated. In addition, plasma wrap around to the backside of the substrate also needs to be minimized or eliminated.

Typically, purge gas such as argon may be directed at the backside edge of the substrate. However even when using the purge gas, backside deposition may still occur. In some examples, greater than 250 Å of backside deposition at 3 mm from the wafer edge may occur.

SUMMARY

A substrate processing system for depositing film on a substrate includes a processing chamber defining a reaction volume and including a substrate support for supporting the substrate. A gas delivery system is configured to introduce process gas into the reaction volume of the processing chamber. A plasma generator is configured to selectively generate RF plasma in the reaction volume. A clamping system is configured to clamp the substrate to the substrate support during deposition of the film. A backside purging system is configured to supply a reactant gas to a backside edge of the substrate to purge the backside edge during the deposition of the film.

In other features, the clamping system includes a vacuum clamping system to clamp the substrate to the substrate support using vacuum pressure. The reactant gas to purge the backside edge includes molecular oxygen and the film includes silicon dioxide. The reactant gas to purge the backside edge includes nitrous oxide and the film includes silicon dioxide. The reactant gas to purge the backside edge includes molecular oxygen and the film includes titanium dioxide. The reactant gas to purge the backside edge includes nitrous oxide and the film includes titanium dioxide. The reactant gas to purge the backside edge includes molecular nitrogen and the film includes silicon nitride. The reactant gas to purge the backside edge includes ammonia and the film includes silicon nitride.

In other features, the film is deposited using atomic layer deposition. The backside purging system flows the reactant gas at a rate sufficient to move the substrate in the absence of the vacuum pressure. The vacuum clamping system includes a valve, a cavity arranged on a substrate-facing surface of the substrate support, wherein the cavity is in fluid communication with the valve, and a vacuum source in fluid communication with the valve.

In other features, the backside purging system includes a valve, a cavity arranged on a substrate-facing surface of the substrate support adjacent to an edge of the substrate, wherein the cavity is in fluid communication with the valve, and a reactant gas source in fluid communication with the valve.

In other features, a controller is configured to control the gas delivery system, the plasma generator, the clamping system, and the backside purging system during one or more atomic layer deposition cycles.

A method for depositing film on a substrate includes arranging a substrate on a substrate support in a reaction volume of a processing chamber; selectively introducing process gases into the reaction volume of the processing chamber and generating RF plasma to deposit film on the substrate; clamping the substrate to the substrate support during deposition of the film; and supplying a reactant gas to a backside edge of the substrate to purge the backside of the substrate edge during the deposition of the film.

In other features, clamping the substrate to the substrate support uses vacuum pressure. The reactant gas to purge the backside edge includes molecular oxygen and the film includes silicon dioxide. The reactant gas to purge the backside edge includes nitrous oxide and the film includes silicon dioxide. The reactant gas to purge the backside edge includes molecular oxygen and the film includes titanium dioxide. The reactant gas to purge the backside edge includes nitrous oxide and the film includes titanium dioxide. The reactant gas to purge the backside edge includes molecular nitrogen and the film includes silicon nitride. The reactant gas to purge the backside edge includes ammonia and the film includes silicon nitride.

In other features, the film is deposited using atomic layer deposition. The method further includes maintaining the processing chamber at a vacuum pressure of 2 to 3 Torr and flowing the reactant gas at a rate of 150 to 450 sccm. The clamping includes arranging a cavity on a substrate-facing surface of the substrate support, wherein the cavity is in fluid communication with a valve; arranging a vacuum source in fluid communication with the valve; and controlling the valve to vacuum clamp the substrate to the substrate support.

In other features, supplying the reactant gas includes arranging a cavity on a substrate-facing surface of the substrate support adjacent to an edge of the substrate, wherein the cavity is in fluid communication with a valve; arranging a reactant gas source in fluid communication with the valve; and controlling the valve to supply the reactant gas to purge the backside edge of the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3 is a perspective view illustrating an example of a substrate support including a vacuum clamping system and a backside purge system according to the present disclosure;

In the drawings, reference numbers may be reused to identify similar and/or identical elements.

DETAILED DESCRIPTION

Systems and methods according to the present disclosure reduce or eliminate backside deposition of film deposited during RF plasma-based ALD. The systems and methods described herein employ backside edge purging with a reactant gas instead of non-reactive or inert gases. For example only, molecular oxygen ($O_2$) or nitrous oxide ($N_2O$) may be used for the backside edge purge gas when depositing silicon dioxide ($SiO_2$) or titanium dioxide ($TiO_2$) films. For example only, molecular nitrogen ($N_2$) or ammonia ($NH_3$) may be used for the backside edge purge gas when depositing silicon nitride (SiN) films. Additionally while $SiO_2$ and $TiO_2$ are specifically disclosed herein, the present disclosure relates to other ALD oxide or nitride films including silicon (Si), hafnium (Hf), aluminum (Al), titanium (Ti), zirconium (Zr), etc.

In some examples, the backside edge purging may be performed using an increased flow rate to reduce or eliminate backside deposition below an acceptable level. To prevent movement of the substrate due to the high flow rate of the backside edge purge gas, the substrate may be clamped. For example only, vacuum clamping of the substrate may use vacuum pressure sufficient to counter the positive pressure that is exerted by the backside purge gas at the edge of the substrate. In some examples, the backside purge gas mitigates parasitic power loss and prevents thickness variations at the edge of the substrate.

In some examples, the reactant gas is supplied to a substrate support that includes edge purge slits or cavities directed at the edges of the substrate. The reactant gas is supplied at a relatively high flow rate to the backside edge of the substrate to suppress backside edge deposition. Vacuum clamping may be used at a center portion of the substrate to hold the substrate in place during deposition. In some examples, the vacuum clamping may be performed by providing one or more slits or cavities below the substrate and by selectively connecting the one or more slits or cavities to a vacuum source using a valve. In some examples, the vacuum pressure exerts downward pressure on a portion of the substrate that is higher than upward pressure exerted on the radially outer edge of the substrate.

In some examples, oxygen is used as a backside purge gas. The use of oxygen helps to prevent light-up in the edge purge slits and/or associated hollow cathode discharge (HCD) signatures that are observed when argon is used. Argon has a lower breakdown voltage than oxygen. When oxygen is used instead of argon, thickness variations on the front side edge profile are also eliminated (particularly at a notch).

Figure 1:
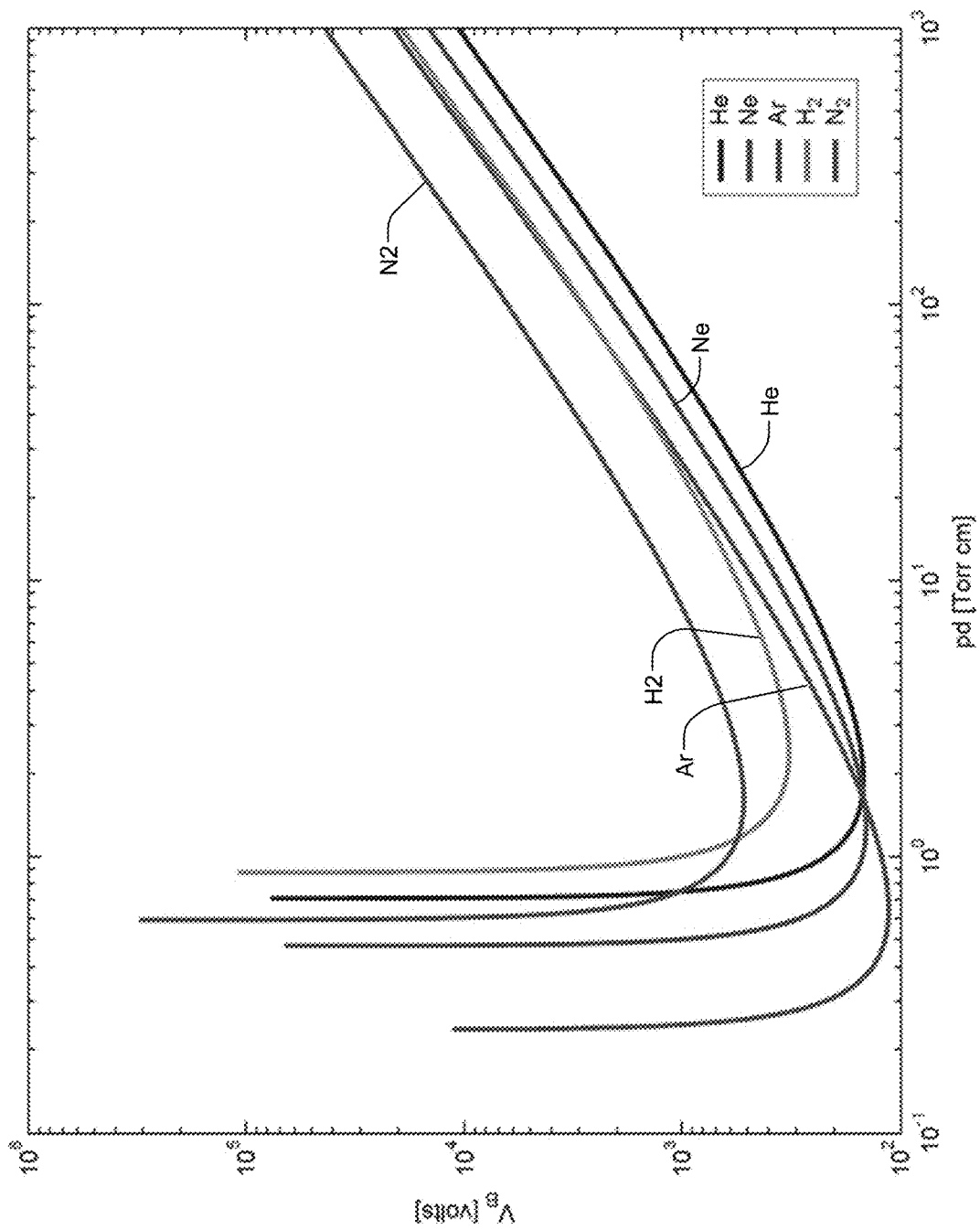
FIG. 1 is a graph illustrating breakdown voltage as a function of pressure for various gases.

Referring now to FIG. 1, a Paschen curve is shown. The breakdown voltage of inert gases such as Argon are relatively low at typical process pressures such as 2-10 Torr. As can be seen, the breakdown voltages of molecular hydrogen and nitrogen are higher. In some examples, the backside purge gas is selected to have a higher breakdown voltage than argon.

Figure 2:
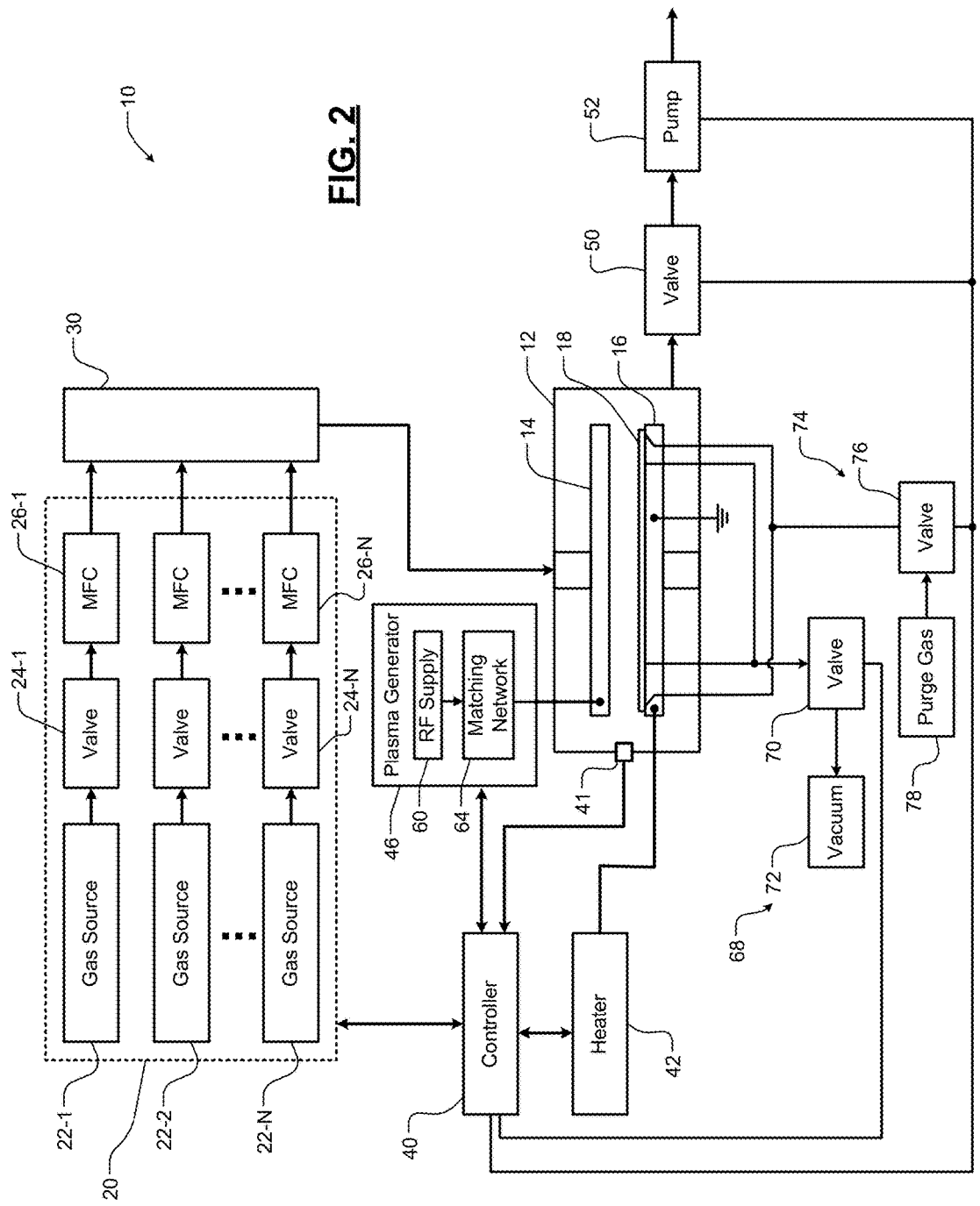
FIG. 2 is a functional block diagram of an example of a substrate processing system with vacuum clamping and backside purging using reactant gas according to the present disclosure.

Referring now to FIG. 2, an example of a substrate processing system 10 for depositing film using ALD, backside purging with a reactant gas and vacuum clamping according to the present disclosure is shown. The substrate processing system 10 includes a processing chamber 12. Process gases may be supplied to the processing chamber 12 using a gas distribution device 14 such as showerhead or other device. A substrate 18 such as a semiconductor wafer may be arranged on a substrate support 16 during processing. The substrate support 16 may include a pedestal, an electrostatic chuck, a mechanical chuck or other type of substrate support.

A gas delivery system 20 may include one or more gas sources 22-1, 22-2, . . . , and 22-N (collectively gas sources 22), where N is an integer greater than one. Valves 24-1, 24-2, . . . , and 24-N (collectively valves 24), mass flow controllers 26-1, 26-2, . . . , and 26-N (collectively mass flow controllers 26), or other flow control devices may be used to controllably supply a precursor dose, a plasma gas mixture, inert gases, purge gases, and mixtures thereof to a manifold 30, which supplies the gas mixture to the processing chamber 12.

A controller 40 may be used to monitor process parameters such as temperature, pressure etc. (using sensors 41) and to control process timing. The controller 40 may be used to control process devices such as the gas delivery system 20, a substrate support heater 42, and/or an RF plasma generator 46. The controller 40 may also be used to evacuate the processing chamber 12 using a valve 50 and pump 52.

The RF plasma generator 46 generates the RF plasma in the processing chamber. The RF plasma generator 46 may be an inductive or capacitive-type RF plasma generator. In some examples, the RF plasma generator 46 may include an RF supply 60 and a matching and distribution network 64. While the RF plasma generator 46 is shown connected to the gas distribution device 14 with the substrate support 16 grounded or floating, the RF plasma generator 46 can be connected to the substrate support 16 and the gas distribution device 14 can be grounded or floating.

A vacuum clamping system 68 may be used to hold the substrate on the substrate support. For example only, the vacuum clamping system 68 may include a valve 70 that selectively connects one or more slits or cavities located in a portion of the substrate support 16 to a vacuum source 72. The one or more slits or cavities may be spaced apart at regular or irregular intervals. Alternately, the one or more slits or cavities may include one or more annular-shaped slits or cavities, one or more arcuate-shaped slits or cavities, and/or any other suitable shapes. As can be appreciated, the substrate 18 may be clamped to the substrate support 16 in other suitable ways such as using electrostatic force, mechanical force, etc.

A backside purge system 74 may be used to supply reactant gas to purge a radially outer edge of the substrate. In some examples, the backside purge system 74 may include a valve 76 that selectively connects a purge gas source 78 (e.g. $O_2$ or $N_2O$ for $SiO_2$ film or $N_2$ or $NH_3$ for SiN film) to one or more edge purge slits or cavities located adjacent to a backside edge of the substrate 18. The one or more edge purge slits or cavities may be spaced at regular or irregular intervals. Alternately, the one or more edge purge slits or cavities may include one or more annular-shaped slits or cavities (and lie adjacent to the entire edge of the substrate), one or more arcuate-shaped slits or cavities, and/or any other suitable shapes. In some examples, the valve 76 may be a variable orifice valve having two or more positions, a multi-stage valve having two or more positions or stages, etc. to allow different flow rates to be used.

Referring now to FIG. 3, an edge ring 104 rests on a radially outer portion of the substrate support 16 and defines an inner ledge 106 to receive a radially outer edge of the substrate 18. The substrate support 16 also defines one or more slits or cavities 114. The slits or cavities 114 are selectively connected by the valve 70 (FIG. 2) to the vacuum source 72. For example, one or more fluid conduits 116 may connect the one or more slits or cavities 114 to the vacuum source 72. The vacuum source 72 evacuates the one or more slits or cavities 114 as shown at 118 and provides vacuum clamping force on a portion of the substrate 18.

One or more edge purge slits or cavities 130 may be selectively connected by the valve 76 (FIG. 2) and one or more fluid conduits 134 to the purge gas source 78. Reactant gas is supplied to the edge purge slits or cavities 130 as shown at 136. In some examples, the edge purge slits or cavities 130 are arranged to direct the reactant gas at the backside edge. For example, the edge purge slits or cavities 130 may be arranged at an angle θ with respect to the substrate 18. In some examples, the angle θ is greater than 0° and less than 90°. In some examples, the angle θ is in the range of approximately 30° to 60° or 40° to 50°.

Without vacuum clamping, flow rates above approximately 150 sccm of backside purge flow appear to visually move the substrate at typical process pressures. As a result, higher flow rates risk causing breakage or defects. With vacuum clamping on the backside (at a typical process pressure of 2.2 Torr), the flow rate can be increased to approximately 450 sccm. In some examples, the flow rate for the backside purge gas is between 150 sccm and 450 sccm, although other values may be used for other process pressures.

Figure 4A:
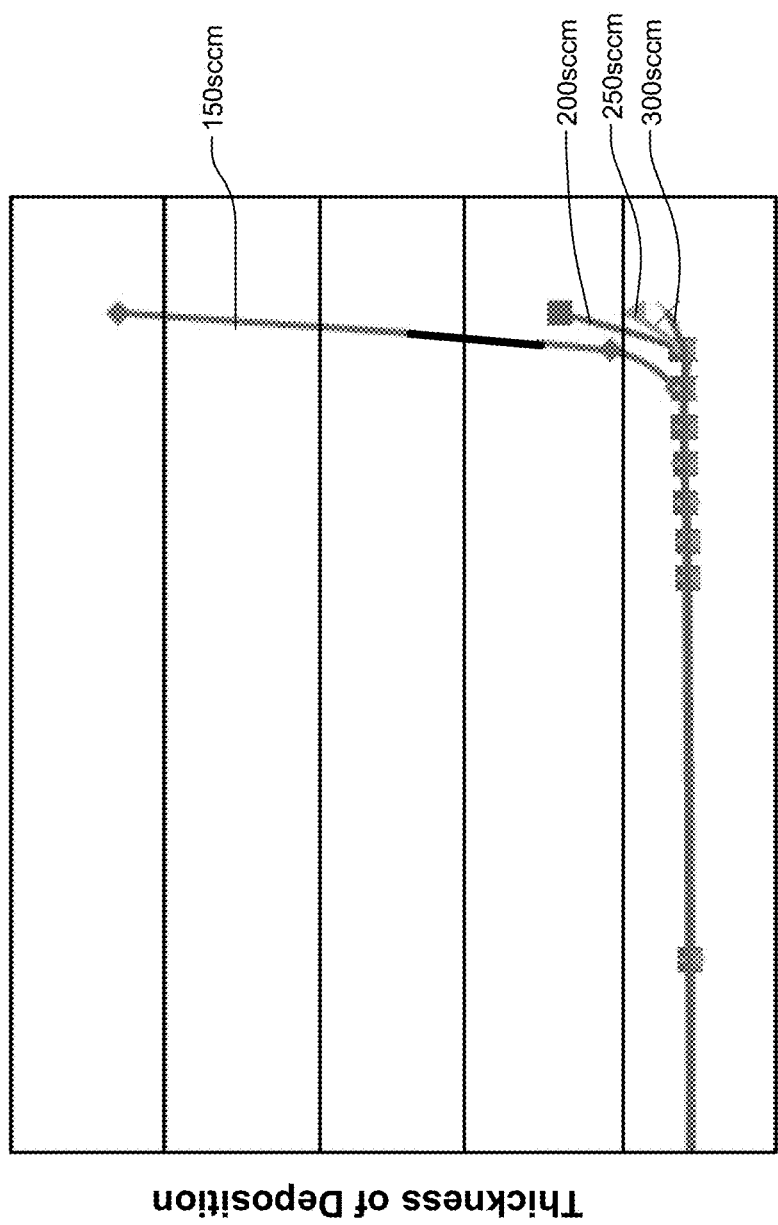
FIG. 4A is a graph illustrating a backside X-line scan (radial) for various backside purge flow rates using oxygen.
Figure 4B:
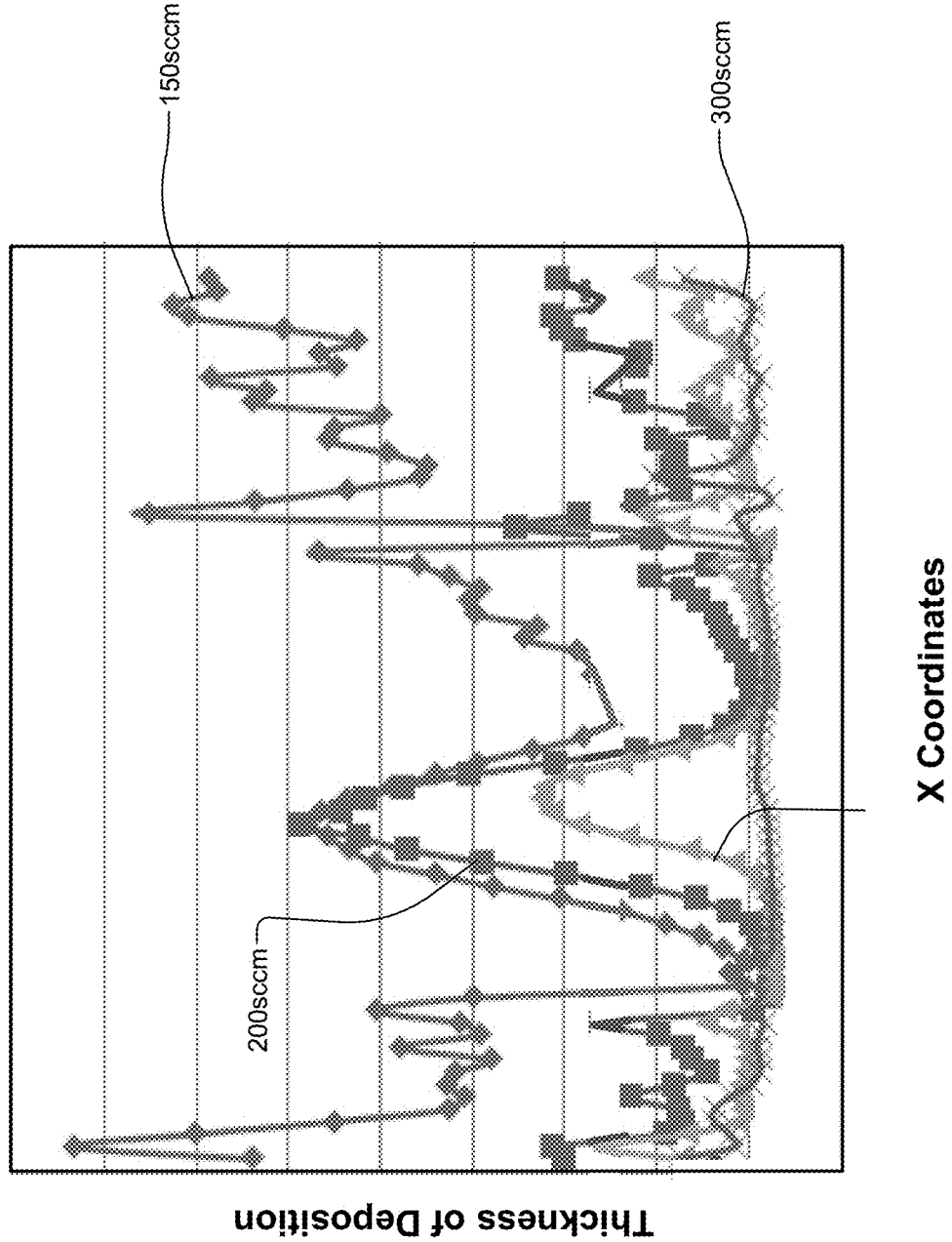
FIG. 4B is a graph illustrating a backside edge ring scan (azimuthal) for various backside purge flow rates using oxygen.

Referring now to FIGS. 4A and 4B, a minimum of 250 sccm flow rate (independent of the nature of gas, Ar or $O_2$) may be used to suppress backside deposition to less than 50 A at 3 mm edge exclusion for a film with a targeted film thickness of 350 A on the front side of the substrate. In this example, approximately 300 sccm shows some additional improved performance.

Figure 5:
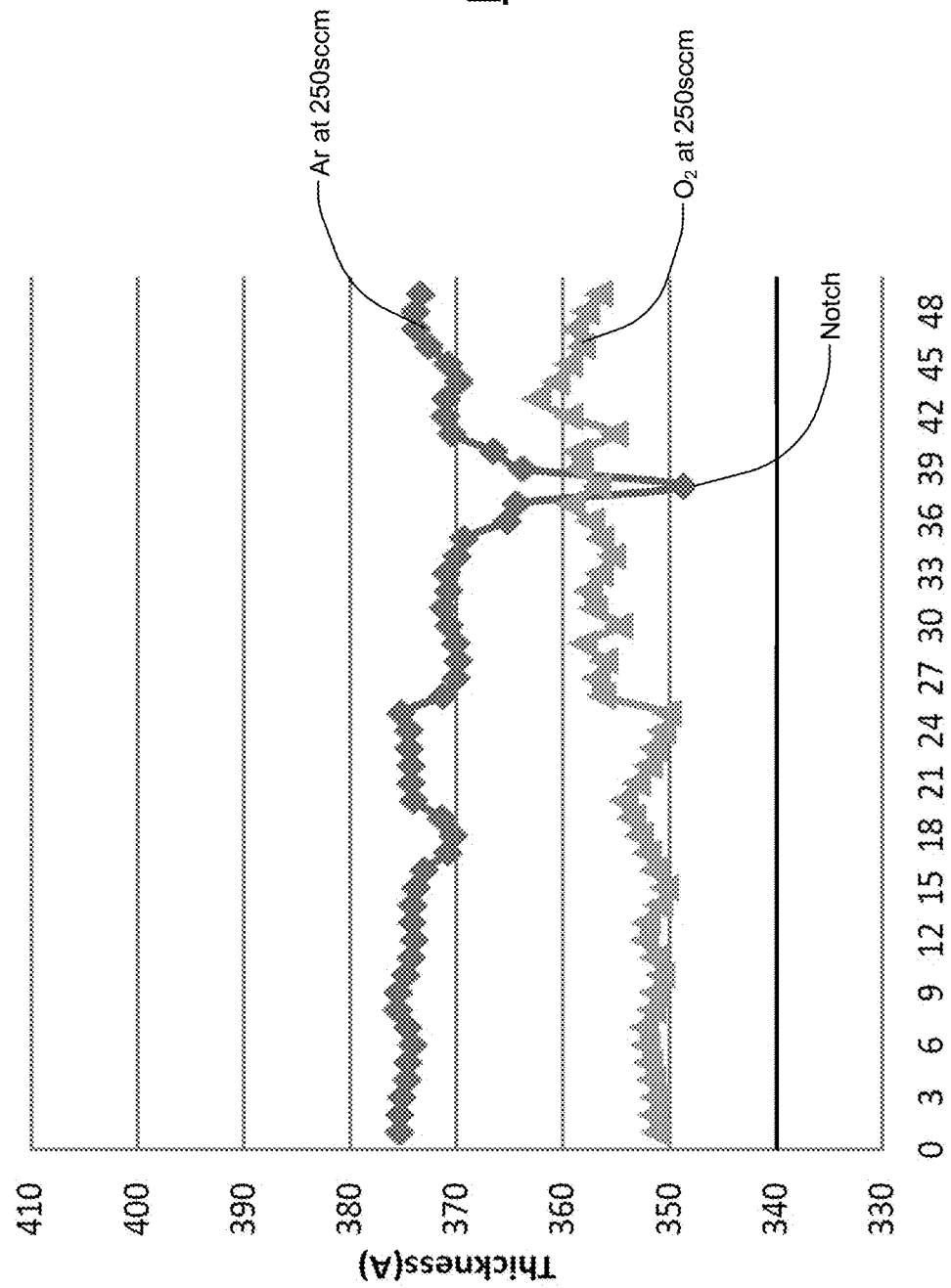
FIG. 5 illustrates front side deposition thickness for argon and oxygen backside purge gases at 250 sccm.

Referring now to FIG. 5, the elimination of thickness discontinuity at a notch is also accomplished when switching backside purge gas from the inert gas Ar to the reactive gas $O_2$. This is attributed to reduced parasitic power loss by using $O_2$, which has a higher breakdown voltage at typical process pressures. There is also reduced hollow cathode discharge (HCD) and light-up with $O_2$ as compared to Ar. Reduction of the deposition rate as shown in FIG. 5 is also indicative of higher power delivered to the wafer with $O_2$ as compared to Ar. Higher power leads to a lower deposition rate due to densification in this plasma conversion regime.

Figure 6:
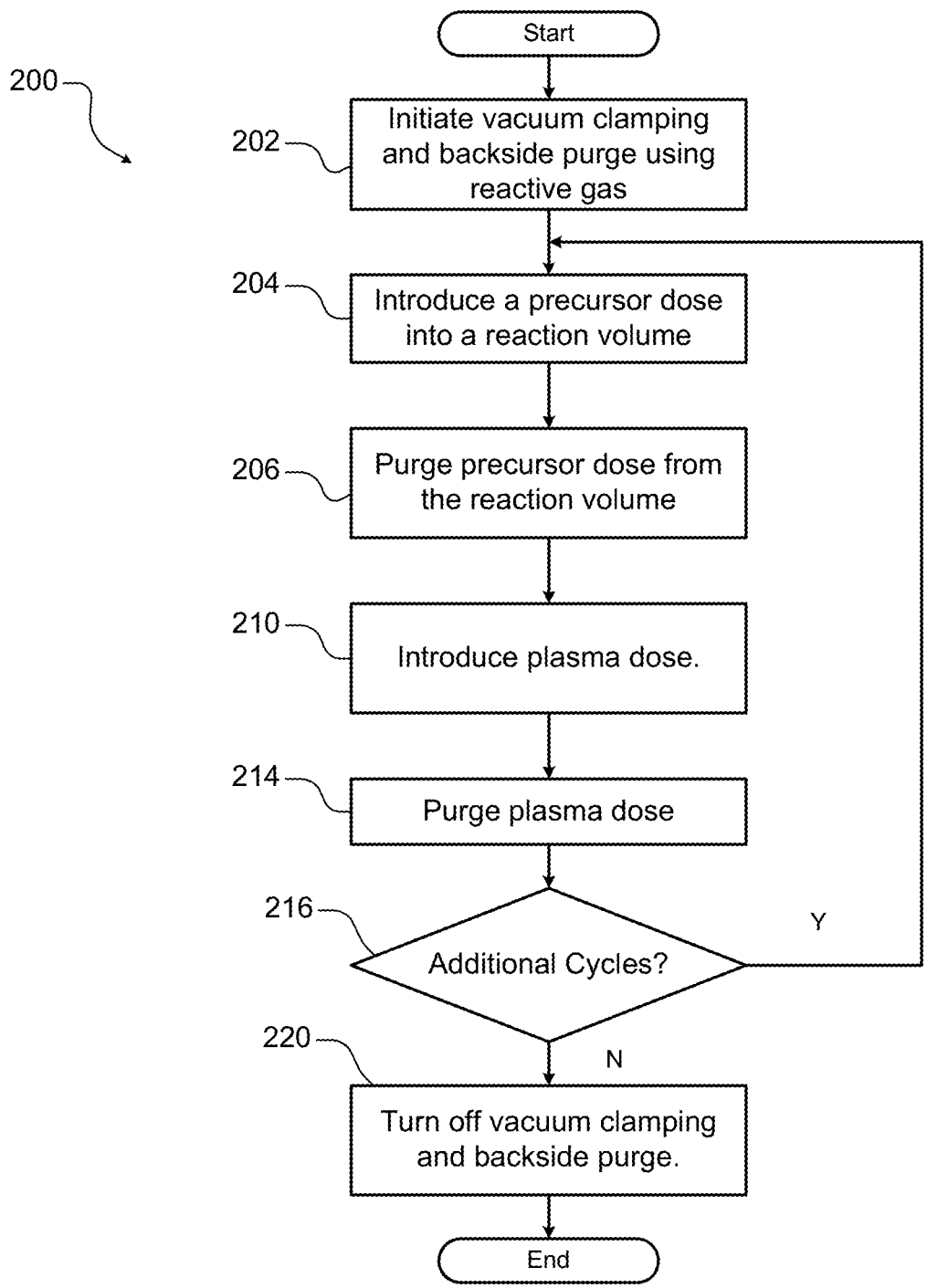
FIG. 6 is a flowchart illustrating an example of a method for processing a substrate using vacuum clamping and backside purging according to the present disclosure.

Referring now to FIG. 6, an example of a method 200 for depositing film using ALD is shown. At 202, vacuum clamping and backside purge using reactive gas are initiated. At 204 a precursor dose is introduced into the reaction volume of the processing chamber. At 206, the precursor dose is purged from the reaction volume after a predetermined exposure period. At 210, a plasma dose is introduced. At 214, the plasma dose is purged. At 216, one or more additional cycles may be performed. If additional cycles are needed as determined at 216, control returns to 204. If 216 is false, control continues with 220 and turns off the vacuum clamping and backside purge.

Figure 7:
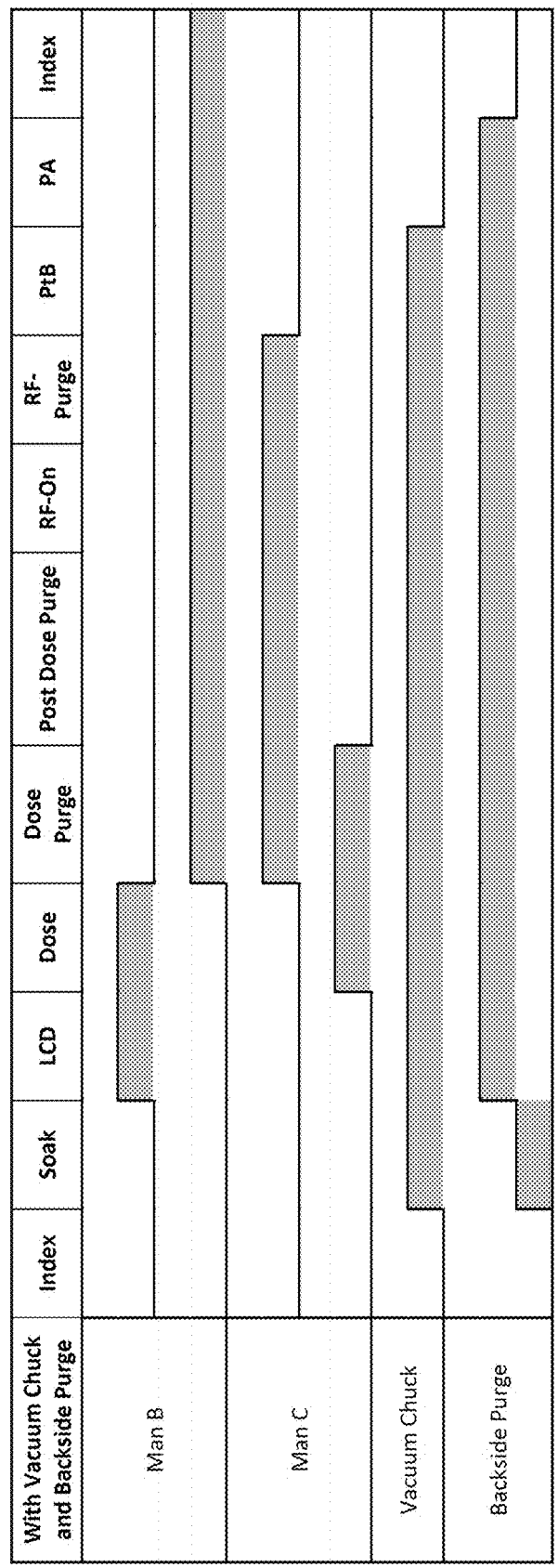
FIG. 7 is a diagram illustrating an example of timing of process gases, vacuum clamping and purge gas during an ALD cycle according to the present disclosure.

Referring now to FIG. 7, other example timing for an ALD cycle is shown. LCD refers to line charge delay, PtB refers to pump to base pressure, and PA refers to pump away. The LCD period is used to charge supply lines prior to actual deposition and the PtB and PA periods are post deposition actions that are used mainly to evacuate the processing chamber and to reduce gas-phase particles. In this example, the backside purge is a two stage signal. A lower value is used during the soak period and then a higher value is used during the rest of the control periods in the ALD cycle. The two stages may be used to allow the vacuum clamping to turn on and reach steady-state vacuum pressure before the backside purge gas reaches steady-state purge pressure. The two stage turn-on reduces the chance of substrate movement as the backside purge gas is turned on.

In some examples, the film is $SiO_2$. For $SiO_2$ film, the precursor dose may include diisopropylaminosilane (DI-PAS), Silanediamine,N,N,N',N'-tetraethyl (SAM24), tris[dimethylamino]silane (3DMAS), or other suitable precursors; the plasma gas mixture may include Ar, $O_2$, $N_2$, $N_2O$, combinations of two or more of the foregoing, or other suitable plasma gas mixtures; and backside purge gas includes $O_2$ or $N_2$.

In some examples, the film is $TiO_2$. The precursor dose may include tetrakis-dimethyl-amino-titanium (TDMAT), titanium tetrachloride ($TiCl_4$), or other suitable precursors; the plasma gas mixture may include Ar, $O_2$, $N_2$, $N_2O$, combinations of two or more of the foregoing, or other suitable plasma gas mixtures; and backside purge gas includes $O_2$ or $N_2$.

In some examples, the film is SiN. The plasma gas mixture may include $NH_3$, $N_2$ and Ar, combinations of two or more of the foregoing, or other suitable plasma gas mixture; and backside purge gas includes $N_2$ or $NH_3$.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for depositing film on a substrate, comprising:
   arranging a substrate on a substrate support in a reaction volume of a processing chamber;
   selectively introducing process gases into the reaction volume of the processing chamber and generating RF plasma to deposit film on the substrate;
   clamping the substrate to the substrate support during deposition of the film; and
   supplying, as a purge gas, a reactant gas to a backside edge of the substrate to purge the backside edge of the substrate during the deposition of the film and during the generating of the RF plasma in the reaction volume, wherein, supplying the purge gas includes
  flowing the purge gas at a rate greater than or equal to 150 sccm to purge the backside edge during the generation of the RF plasma,
  providing molecular oxygen as the purge gas, and
  providing the molecular oxygen as the purge gas to (i) inhibit at least one of plasma light-up and hollow cathode discharge signatures proximate the backside edge during the generation of the RF plasma in the reaction volume and (ii) inhibit parasitic power loss associated with the purge gas.

2. The method of claim 1, wherein clamping the substrate to the substrate support uses vacuum pressure.

3. The method of claim 1, wherein the film includes silicon dioxide.

4. The method of claim 1, wherein the film is deposited using atomic layer deposition.

5. The method of claim 1, further comprising:
maintaining the processing chamber at a vacuum pressure of 2 to 3 Torr.

6. The method of claim 2, wherein the clamping includes:
  arranging a cavity on a substrate-facing surface of the substrate support, wherein the cavity is in fluid communication with a valve;
  arranging a vacuum source in fluid communication with the valve; and
  controlling the valve to vacuum clamp the substrate to the substrate support.

7. The method of claim 1, wherein supplying the reactant gas includes:
  arranging a cavity on a substrate-facing surface of the substrate support adjacent to an edge of the substrate, wherein the cavity is in fluid communication with a valve;
  arranging a reactant gas source in fluid communication with the valve; and
  controlling the valve to supply the reactant gas to purge the backside edge of the substrate.

* * * * *